United States Patent
Weng

(10) Patent No.: US 8,089,326 B2
(45) Date of Patent: Jan. 3, 2012

(54) PVT-INDEPENDENT CURRENT-CONTROLLED OSCILLATOR

(75) Inventor: Meng-Chih Weng, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 109 days.

(21) Appl. No.: 12/605,436

(22) Filed: Oct. 26, 2009

(65) Prior Publication Data

US 2011/0095831 A1  Apr. 28, 2011

(51) Int. Cl.
*H03L 1/00* (2006.01)

(52) U.S. Cl. ......... 331/176; 331/66; 331/70; 331/108 A; 331/185

(58) Field of Classification Search ............ 331/66, 331/70, 108 A, 176, 185
See application file for complete search history.

(56) References Cited

U.S. PATENT DOCUMENTS

| | | | | |
|---|---|---|---|---|
| 5,748,044 A | * | 5/1998 | Xue | 331/2 |
| 5,892,409 A | * | 4/1999 | Boerstler | 331/57 |
| 5,909,150 A | * | 6/1999 | Kostelnik et al. | 331/34 |
| 6,157,270 A | * | 12/2000 | Tso | 331/176 |
| 7,463,101 B2 | * | 12/2008 | Tung | 331/57 |
| 2010/0237955 A1 | * | 9/2010 | Mahooti | 331/66 |

* cited by examiner

*Primary Examiner* — Arnold Kinkead
*Assistant Examiner* — Richard Tan
(74) *Attorney, Agent, or Firm* — Thomas|Kayden

(57) ABSTRACT

The invention discloses a PVT-independent current-controlled oscillator, including a PV-controller, a current-controlled oscillator and a T-controller. The current-controlled oscillator is coupled to the PV-controller and outputs an oscillation frequency. The T-controller is coupled to the PV-controller and the current-controlled oscillator, providing a total current to be shared by the PV-controller and the current-controlled oscillator, wherein the PV-controller decreases the shared current of the current-controlled oscillator by increasing the shared current of the PV-controller if the oscillation frequency is higher than a predetermined frequency due to a process variation of the current-controlled oscillator, and increases the shared current of the current-controlled oscillator by decreasing the shared current of the PV-controller if the oscillation frequency is lower than the predetermined frequency due to the process variation of the current-controlled oscillator, thereby dynamically adjusting the oscillation frequency.

9 Claims, 6 Drawing Sheets

PVT-INDEPENDENT CURRENT-CONTROLLED OSCILLATOR

BACKGROUND OF THE INVENTION

1. Field of the Invention

The invention relates generally to a current-controlled oscillator (CCO), and more particularly, to a current-controlled oscillator that is not affected by process variation, supply voltage variation, and temperature deviation.

2. Description of the Related Art

A current-controlled oscillator is an electronic oscillator designed to generate an oscillation frequency through the control of current. However, similar to most electronic components, the performance of a current-controlled oscillator is often affected by various factors such as process variation, supply voltage variation, and temperature deviation (also called PVT hereinafter). Referring to FIG. 1, an illustrative diagram of a current-controlled oscillator is shown. In FIG. 1, the current-controlled oscillator 10 is designed to generate an oscillation frequency $F_{out}$, which may be adjusted by the current source $I_C$. However, although having a fixed current source $I_C$, the oscillation frequency $F_{out}$ that is output is still varied due to PVT.

FIG. 2 depicts a characteristic curve of a current-controlled oscillator. It is clearly shown in FIG. 2, that the oscillation frequency $F_{out}$ output from the current-controlled oscillator 10 is inversely related to temperature, which is undesired for an ideal current-controlled oscillator.

BRIEF SUMMARY OF THE INVENTION

In light of the previously described problems, a current-controlled oscillator that is not affected by process variation, supply voltage variation, and temperature deviation is provided.

An embodiment of the invention discloses a PVT-independent current-controlled oscillator, comprising a PV-controller, a current-controlled oscillator and a T-controller. The current-controlled oscillator is coupled to the PV-controller and outputs an oscillation frequency. The T-controller is coupled to the PV-controller and the current-controlled oscillator, providing a total current to be shared by the PV-controller and the current-controlled oscillator, wherein the PV-controller decreases the shared current of the current-controlled oscillator by increasing the shared current of the PV-controller if the oscillation frequency is higher than a predetermined frequency due to a process variation of the current-controlled oscillator, and increases the shared current of the current-controlled oscillator by decreasing the shared current of the PV-controller if the oscillation frequency is lower than the predetermined frequency due to the process variation of the current-controlled oscillator, thereby dynamically adjusting the oscillation frequency.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
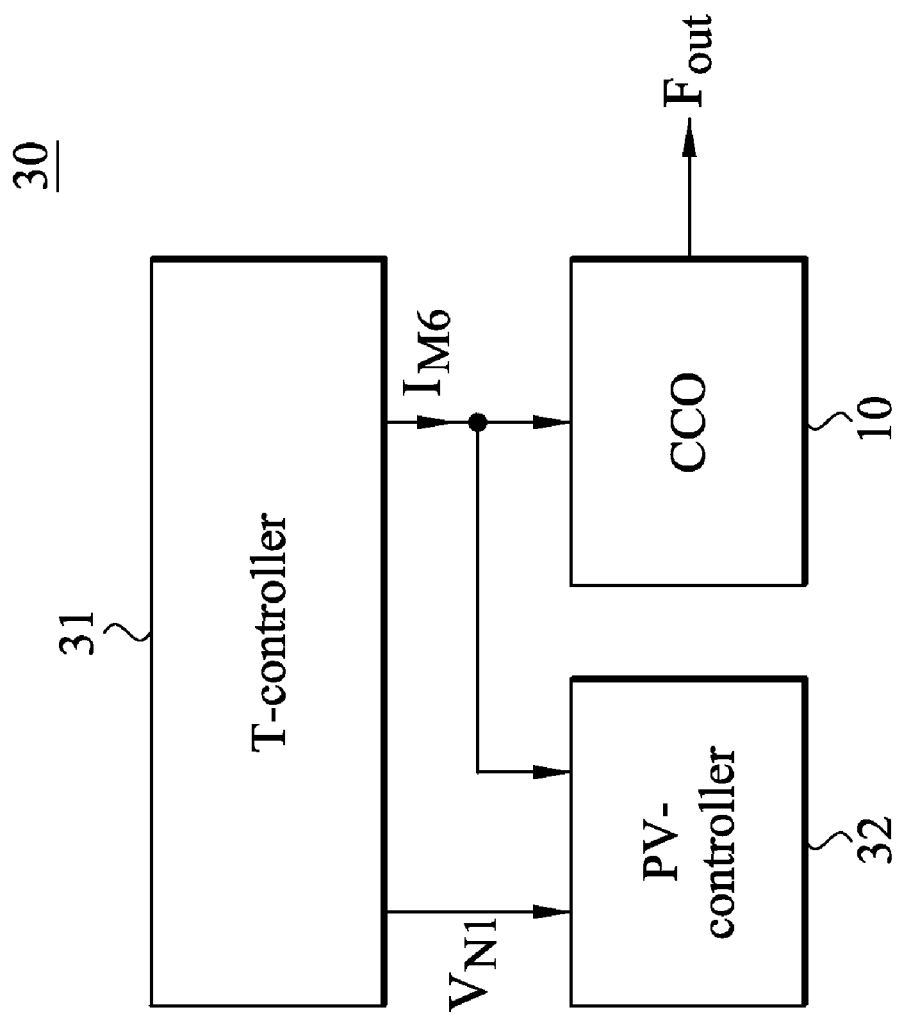
FIG. 3 depicts a diagram of a PVT-independent current-controlled oscillator according to an embodiment of the invention.

FIG. 3 depicts a diagram of a PVT-independent current-controlled oscillator according to an embodiment of the invention. The PVT-independent current-controlled oscillator 30 comprises a temperature controller (T-controller) 31, a process and voltage controller (PV-controller) 32 and a current-controlled oscillator 10. The T-controller 31 provides a voltage $V_{N1}$ to the PV-controller 32 and a current $IM_6$ to be shared by the PV-controller 32 and the current-controlled oscillator 10. In addition, the T-controller 31 prevents the current-controlled oscillator 10 from being affected by temperature deviations and the PV-controller 32 prevents the current-controlled oscillator 10 from being affected by the process and supply voltage variations, thereby enabling the current-controlled oscillator 10 to output an oscillation frequency that is not affected by process variation, supply voltage variation, and temperature deviation (PVT).

Figure 4:
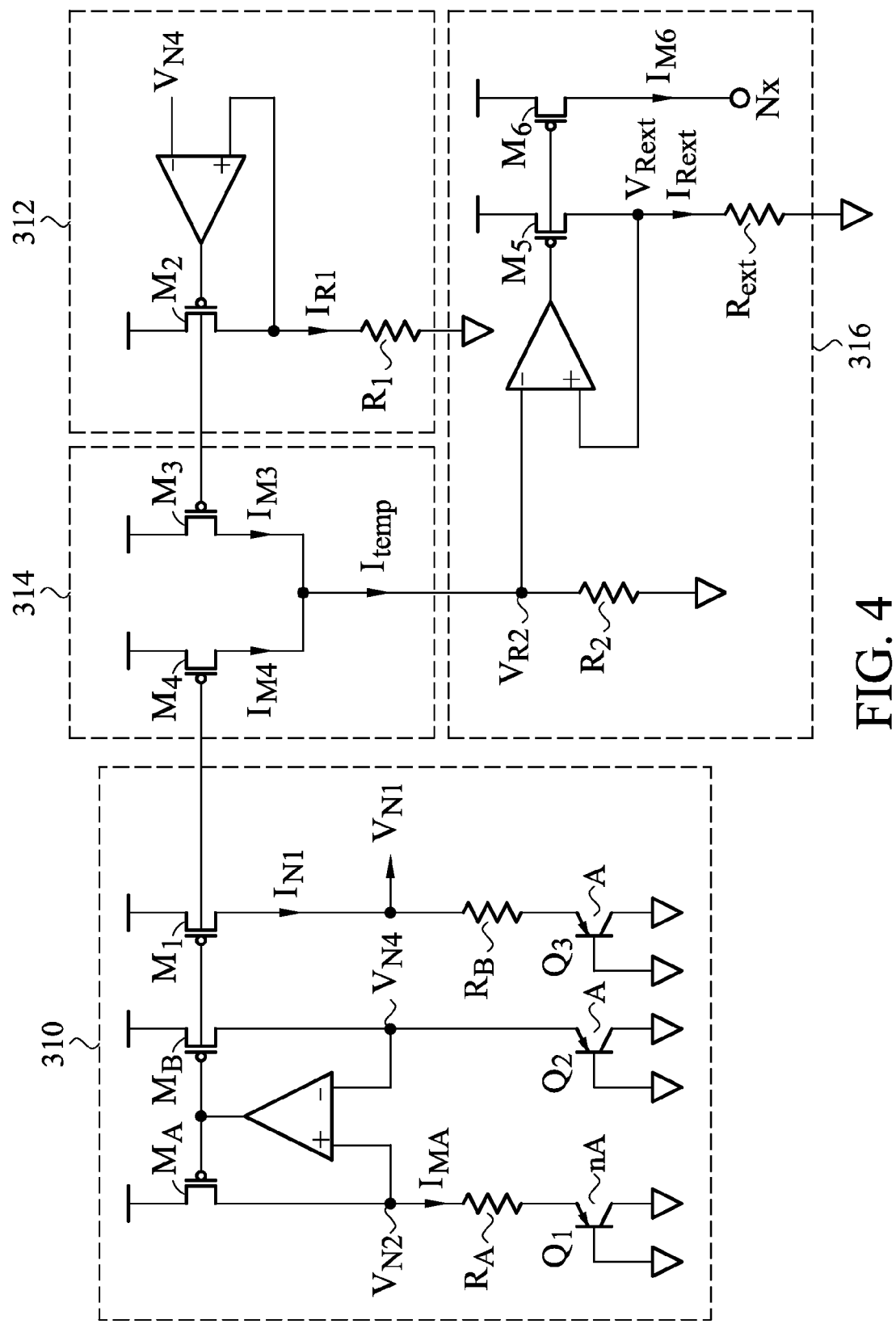
FIG. 4 depicts a circuit diagram of a T-controller according to an embodiment of the invention.

FIG. 4 depicts a circuit diagram of a T-controller according to an embodiment of the invention. The T-controller 31 comprises a bandgap circuit 310, a first regulator circuit 312, a PMOS transistors pair 314 and a second regulator circuit 316. The bandgap circuit 310 generates a first bandgap voltage $V_{N1}$ that is not affected by PVT, a second bandgap voltage $V_{N4}$ that is inversely proportional to the temperature (the higher the temperature the lower the second bandgap voltage $V_{N4}$), and a bandgap current $I_{N1}$. The first regulator circuit 312 comprises an operational amplifier, a PMOS transistor $M_2$ and a resistor $R_1$. The operational amplifier has a first input, a second input and an output. The first input receives the second bandgap voltage $V_{N4}$. The second input is coupled to one end of the resistor $R_1$ and the drain of the PMOS transistor $M_2$. The output of the operational amplifier is coupled to the gate of the PMOS transistor $M_2$. The source of the PMOS transistor $M_2$ is coupled to the power supply. Another end of the resistor $R_1$ is coupled to the ground. The PMOS transistors pair 314 has a PMOS transistor $M_4$ and a PMOS transistor $M_3$. The PMOS transistor $M_4$ has a gate coupled to the gate of the PMOS transistor $M_1$ of the bandgap circuit 310, a source coupled to the power supply, and a drain. The PMOS transistor $M_3$ has a gate coupled to the gate of the PMOS transistor $M_2$ of the first regulator circuit 312, a source coupled to the power supply, and a drain coupled to the drain of the first PMOS transistor $M_4$. The second regulator circuit 316 comprises a resistor $R_2$, an operational amplifier, a PMOS transistor $M_5$, a PMOS transistor $M_6$ and a high-precision resistor Rext. The resistor $R_2$ has a first end coupled to the PMOS transistors pair 314, and a second end coupled to the ground. The operational amplifier has a first input coupled to the first end of the resistor $R_2$, a second input and an output. The first PMOS transistor $M_5$ has a gate coupled to the output of the operational amplifier, a source coupled to the power supply, and a drain coupled to the second input of the operational amplifier. The PMOS transistor $M_6$ has a gate coupled to the gate of the PMOS transistor $M_5$, a source coupled to the power supply, and a drain coupled to the current-controlled oscillator 10 and the PV-controller 32. The high-precision resistor is coupled between the drain of the first PMOS transistor $M_5$ and the ground.

In the bandgap circuit 310, if the voltage $V_{N2}$ is equal to the second bandgap voltage $V_{N4}$, then the following equation will be satisfied:

$$I_{MA} \cdot R_A + V_{EB1} = V_{EB2}$$

Therefore, $$I_{MA} * R_A = V_{BE1} - V_{BE2}$$

wherein, $$V_{BE1} = V_T \ln \frac{n \cdot I_{MA}}{I_{S1}},$$

$$V_{BE2} = V_T \ln \frac{n \cdot I_{N1}}{I_{S2}}.$$

Therefore, $$I_{MA} * R_A = V_T \ln(n).$$

Based on this, if three MOS transistors $M_A$, $M_B$ and $M_1$ are the same, then:

$$V_{N1} = \left( \frac{V_T \ln(n)}{R_A} \right) * R_B + V_{EB3}.$$

Figure 2:
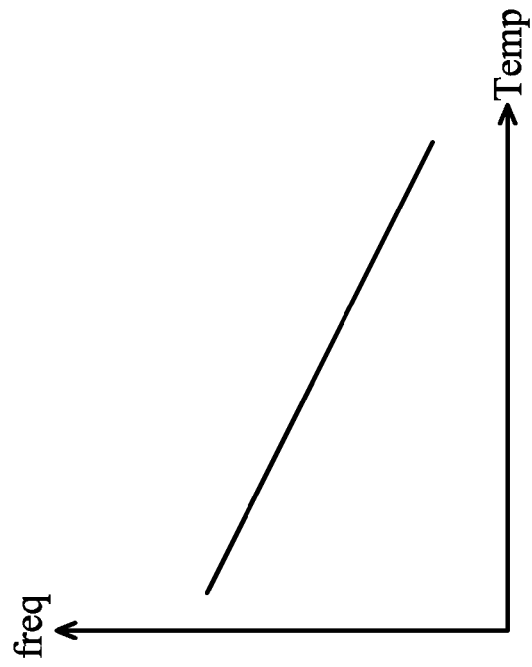
FIG. 2 depicts a characteristic curve of a current-controlled oscillator.
Figure 1:
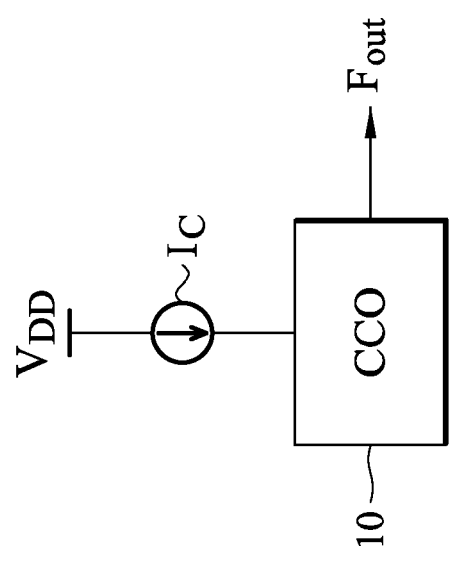
FIG. 1 depicts an illustrative diagram of a current-controlled oscillator.

Wherein, the bandgap current $I_{N1}$ is determined to be $(V_T * \ln(n)/R_A)$, which is proportional to the temperature. Since the gate of the PMOS transistor $M_1$ is connected to the gate of the PMOS transistor $M_4$ and the source of the PMOS transistor $M_1$ is also connected to the source of the PMOS transistor $M_4$, the bandgap current $I_{N1}$ reflects the current $IM_4$ on the PMOS transistor $M_4$. The reflected current $IM_4$ may or may not be the same as the bandgap current $I_{N1}$, depending on the length-width ratio of the PMOS transistors $M_1$ and $M_4$. Here, because the bandgap current $I_{N1}$ is proportional to the temperature, the current $IM_4$ is also proportional to the temperature. In addition, the first regulator circuit 312 receives the second bandgap voltage $V_{N4}$ and generates a regulator current $IR_1$, which is the second bandgap voltage $V_{N4}$ divided by the resistor $R_1$ (i.e., $V_{N4}/R_1$). Since the gate of the PMOS transistor $M_2$ is connected to the gate of the PMOS transistor $M_3$ and the source of the PMOS transistor $M_2$ is also connected to the source of the PMOS transistor $M_3$, the regulator current $IR_1$ reflects the current $IM_3$ on the PMOS transistor $M_3$. The reflected current $IM_3$ may or may not be the same as the regulator current $IR_1$, depending on the length-width ratio of the PMOS transistors $M_2$ and $M_3$. Here, because the second bandgap voltage $V_{N4}$ is inversely proportional to the temperature, the current $IM_3$ is also inversely proportional to the temperature. The currents $IM_3$ and $IM_4$ form a temporary total current $I_{temp}$. The temporary total current $I_{temp}$ is used to compensate for undesired temperature effect of the current-controlled oscillator 10. For example, by properly choosing the value of the resistor $R_1$, when the oscillation frequency of the current-controlled oscillator 10 decreases as the temperature increases (as described in the FIG. 2 of related art), the temporary total current $I_{temp}$ may be raised, providing more current $IM_6$ (the detail is described later) to the current-controlled oscillator 10. With more current provided, the oscillation frequency of the current-controlled oscillator 10 is higher, thereby making up for the decrement of the oscillation frequency caused by the temperature offset.

However, the temporary total current $I_{temp}$ may vary due to the tolerance of the resistor (the resistor tolerance may be as high as 20%). In light of this problem, a high-precision external resistor Rext is used in the second regulator circuit 316, as illustrated below.

The second regulator circuit 316 receives the temporary total current $I_{temp}$ from the PMOS transistor pair 314 and generates a voltage $V_{R2}$ at an input of an operational amplifier thereof. Therefore, a voltage $V_{Rext}$ which is equal to the voltage $V_{R2}$ is generated at the external resistor Rext. Since the external resistor $R_{ext}$ is a high-precision resistor with little tolerance, there is minimal variation of the current $I_{Rext}$ on the external resistor $R_{ext}$. In addition, because the gate of the PMOS transistor $M_5$ is connected to the gate of the PMOS transistor $M_6$ and the source of the PMOS transistor $M_5$ is also connected to the source of the PMOS transistor $M_6$, the current $I_{Rext}$ reflects the total current $IM_6$ on the PMOS transistor $M_6$. The reflected current $IM_6$ may or may not be the same as the current $I_{Rext}$, depending on the length-width ratio of the PMOS transistors $M_5$ and $M_6$. The total current $IM_6$ is the final current that is output and shared by the T-controller 31 and the PV-controller 32.

So far, description has been made concerning how the T-controller 31 prevents the current-controlled oscillator 10 from being affected by temperature deviations. In the following, the embodiment will illustrate how the PV-controller 32 prevents the current-controlled oscillator 10 from being affected by process and supply voltage variations.

Figure 5A:
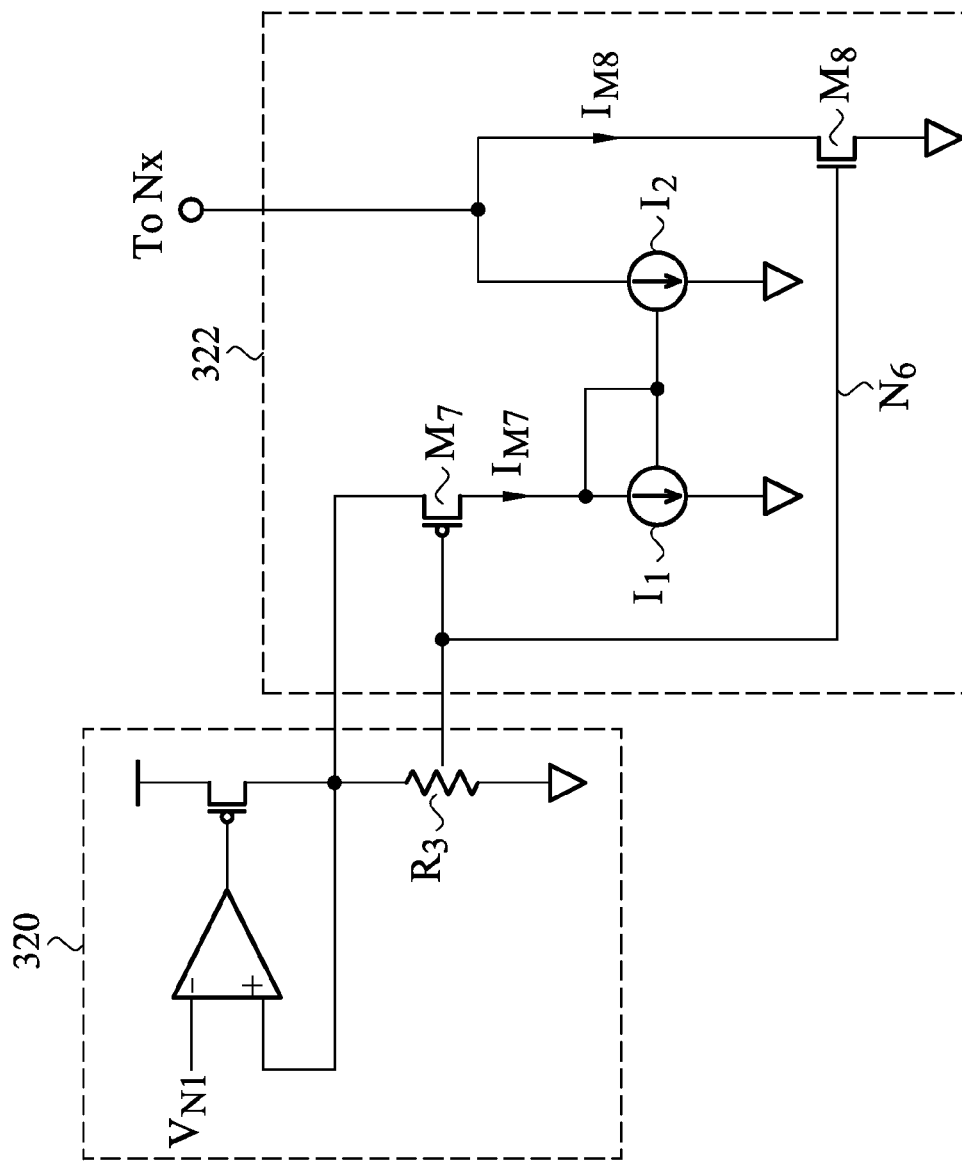
FIG. 5A depicts a full circuit diagram of a PV-controller according to an embodiment of the invention.

FIG. 5A depicts a circuit diagram of a PV-controller according to an embodiment of the invention. The PV-controller 32 may comprise a third regulator circuit 320 and an adjust circuit 322. The third regulator circuit 320 comprises an operational amplifier, a PMOS transistor and a resistor $R_3$. The operational amplifier has a first input receiving the first bandgap voltage $V_{N1}$, a second input and an output. The PMOS transistor has a gate coupled to the output of the operational amplifier, a source coupled to the power supply and a drain coupled to the second input of the operational amplifier. The resistor $R_3$ is coupled between the drain of the PMOS transistor and the ground. The adjust circuit 322 may comprise a PMOS transistor $M_7$, an NMOS transistor $M_8$ and a current mirror, as shown in FIG. 5A. The PMOS transistor $M_7$ has a source coupled to the first bandgap voltage $V_{N1}$, and a gate coupled to the resistor $R_3$. The current mirror is coupled to the PMOS transistor $M_7$. The NMOS transistor $M_8$ has a drain coupled to the $N_X$ where the total current $IM_6$ is provided, a gate coupled to the resistor $R_3$, and a source coupled to the ground.

Figure 5B:
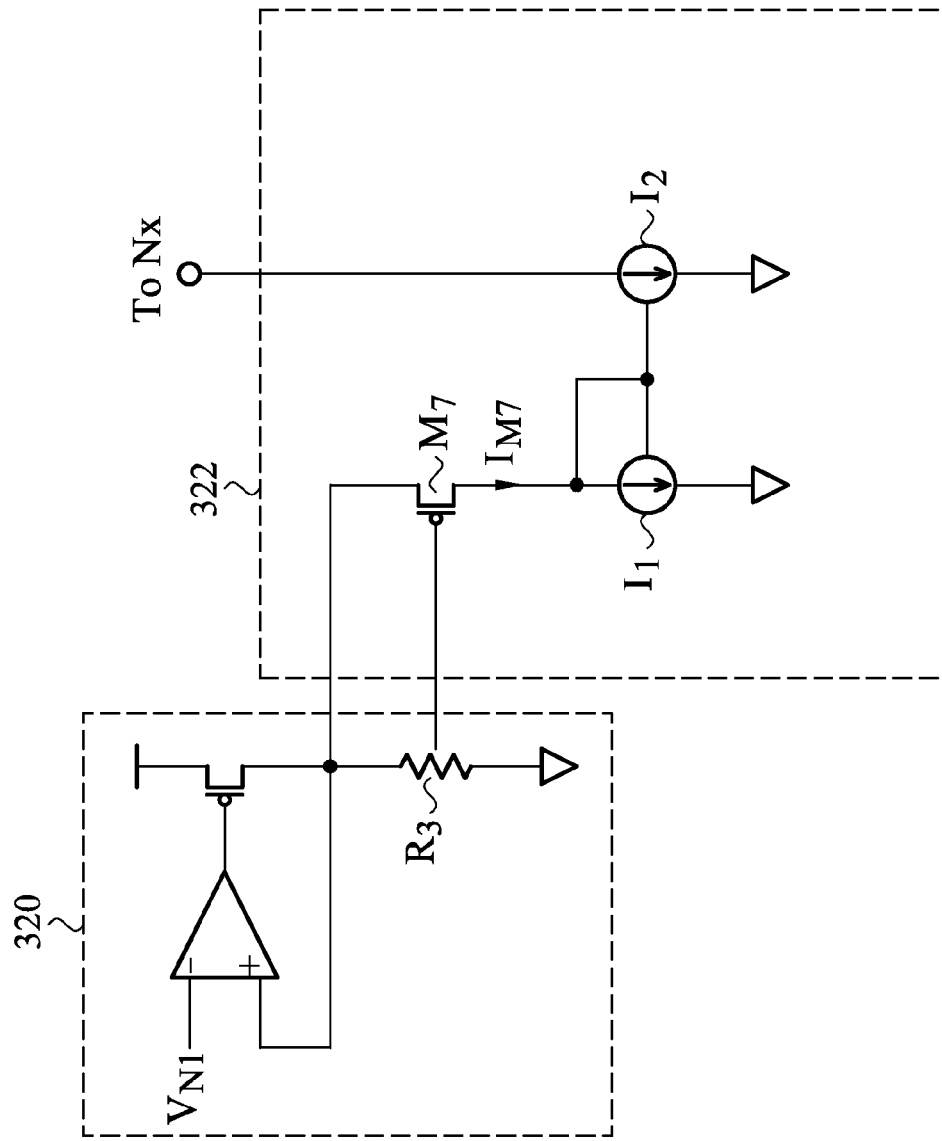
FIG. 5B depicts a circuit diagram of a partial PV-controller according to an embodiment of the invention.
Figure 5C:
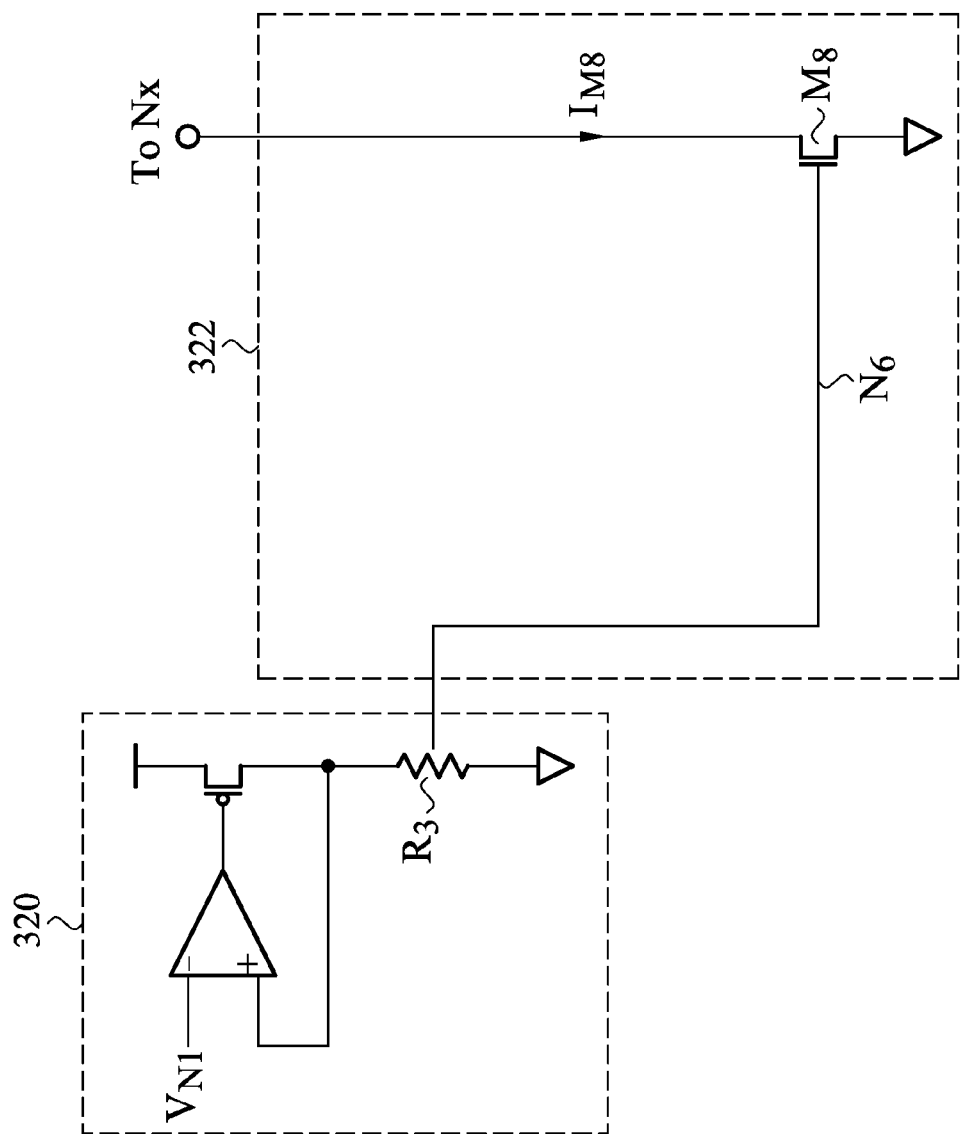
FIG. 5C depicts a circuit diagram of a partial PV-controller according to another embodiment of the invention.

The components of the adjust circuit 322 may be dependent on the type of components within the current-controlled oscillator 10. Specifically, the current-controlled oscillator 10 may comprise only PMOS or NMOS transistors, or even both. If the current-controlled oscillator 10 comprises only a PMOS transistor, the corresponding PMOS transistor $M_7$ will be required in the adjust circuit 322, as shown in FIG. 5B. If the current-controlled oscillator 10 comprises only an NMOS transistor, the corresponding NMOS transistor $M_8$ will be required in the adjust circuit 322, as shown in FIG. 5C. Similarly, if the current-controlled oscillator 10 comprises both PMOS and NMOS transistors, the corresponding PMOS and NMOS transistors $M_7$ and $M_8$ are both required in the PV-controller 32, as shown in FIG. 5A. Referring to FIG. 5A, the PV-controller 32 receives the first bandgap voltage $V_{N1}$ provided by the T-controller 31. Since the first bandgap voltage $V_{N1}$ is not affected by PVT and the resistor tolerance, the voltage divided by the resistor $R_3$ (divided voltage) is also not affected by PVT and the resistor. This provides a stable voltage difference between the gate and the source of the PMOS transistor $M_7$ (i.e. $V_{SG}$). As a result, the current $IM_7$ on the PMOS transistor $M_7$ is not affected by supply voltage variations (if the PMOS transistor $M_7$ is connected to a supply voltage as a power supply, the current on the PMOS transistor $M_7$ would suffer from supply voltage variations). Based on the same principle, the voltage difference between the gate and the source of the NMOS transistor $M_8$ (i.e. $V_{GS}$) is also stable.

Thus, description has been made concerning how the PV-controller 32 prevents the current-controlled oscillator 10 from being affected by supply voltage variations. In the following, the embodiment will illustrate how the PV-controller 32 prevents the current-controlled oscillator 10 from being affected by process variations. Referring to the following formulas:

$$I_{M7} = \mu_p C_{ox}\left(\frac{W}{L}\right)(V_{SG7} - |V_{TH7}|)^2 \text{ for PMOS transistor } M_7,$$

$$I_{M8} = \mu_n C_{ox}\left(\frac{W}{L}\right)(V_{GS8} - V_{TH8})^2 \text{ for NMOS transistor } M_8.$$

Based on the circuit structure of FIG. 5A, the gate-source voltage ($V_{GS}$) of PMOS and NMOS transistors $M_7$ and $M_8$ is not affected by PVT and resistor tolerance. Therefore, the currents $I_{M7}$ and $I_{M8}$ are now dependent on the threshold voltage thereof ($V_{TH}$). The magnitude of the threshold voltage $V_{TH}$ is dependent on the process variation of the MOS transistor. When the oscillation frequency of the current-controlled oscillator 10 is higher than a predetermined frequency (frequency shifting) due to a process variation of F (corner=F), the current $IM_7/IM_8$ is higher. This is because the process variation of F means a smaller threshold $V_{TH}$, which results in a larger current $IM_7/IM_8$ that is shared from the total current $IM_6$. With larger current $IM_7/IM_8$ shared from the total current $IM_6$, the current provided to the current-controlled oscillator 10 is lower, further decreasing the oscillation frequency of the current-controlled oscillator 10. Note that the PV-controller 32 uses the same type of MOS transistor (P or N type of MOS transistor) as the current-controlled oscillator 10, so the process variation of F for the transistor within the current-controlled oscillator 10 also means the process variation of F within the PV-controller 32. Note that the description of the T-controller 31 and PV-controller 32 is completed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A PVT-independent current-controlled oscillator, comprising:
a PV-controller, the current of the PV-controller is intentionally made a function of the process and supply voltage variations;
a current-controlled oscillator coupled to the PV-controller and outputting an oscillation frequency; and
a T-controller coupled to the PV-controller and the current-controlled oscillator, providing a total current to be shared by the PV-controller and the current-controlled oscillator,
wherein the current of the T-controller is intentionally made a function of temperature deviation, and the PV-controller decreases the shared current of the current-controlled oscillator by increasing the shared current of the PV-controller if the oscillation frequency is higher than a predetermined frequency due to a process variation of the current-controlled oscillator, and increases the shared current of the current-controlled oscillator by decreasing the shared current of the PV-controller if the oscillation frequency is lower than the predetermined frequency due to the process variation of the current-controlled oscillator, thereby dynamically adjusting the oscillation frequency.

2. The PVT-independent current-controlled oscillator as claimed in claim 1, wherein the T-controller comprises:
a bandgap circuit generating a first bandgap voltage and a second bandgap voltage and a bandgap current, wherein the bandgap current is generated from the first bandgap voltage;
a first regulator circuit generating a regulator current according to the second bandgap voltage;
a pair of PMOS transistors generating a temporary total current according to the regulator current and the bandgap current; and
a second regulator circuit generating the total current according to the temporary total current.

3. The PVT-independent current-controlled oscillator as claimed in claim 2, wherein the PV-controller comprises:
a third regulator circuit receiving the first bandgap voltage and dividing the first bandgap voltage into a divided voltage; and
an adjust circuit coupled to the third regulator circuit, receiving the total current, and adjusting the magnitude of the current of the PV-controller shared from the total current according to the divided voltage.

4. The PVT-independent current-controlled oscillator as claimed in claim 3, wherein, when the current-controlled oscillator comprises a PMOS transistor, the adjust circuit comprises:
a PMOS transistor having a source coupled to the first bandgap voltage, and a gate coupled to the divided voltage; and
a current mirror coupled to the PMOS transistor, wherein the magnitude of the current of the PV-controller shared from the total current is higher when the current of the PMOS transistor is increased, and the magnitude of the current of the PV-controller shared from the total current is lower when the current of the PMOS transistor is decreased.

5. The PVT-independent current-controlled oscillator as claimed in claim 3, wherein, when the current-controlled oscillator comprises an NMOS transistor, the adjust circuit comprises:
an NMOS transistor having a drain coupled to the total current, a gate coupled to the divided voltage, and a source coupled to a ground, wherein the magnitude of the current shared from the total current is higher when the current of the NMOS transistor is increased, and the magnitude of the current shared from the total current is lower when the current of the NMOS transistor is decreased.

6. The PVT-independent current-controlled oscillator as claimed in claim 3, wherein the third regulator circuit comprises:
- an operational amplifier having a first input receiving the first bandgap voltage, a second input and an output;
- a PMOS transistor having a gate coupled to the output of the operational amplifier, a source coupled to a power supply and a drain coupled to the second input; and
- a resistor coupled between the drain and a ground.

7. The PVT-independent current-controlled oscillator as claimed in claim 2, wherein the first regulator circuit comprises:
- an operational amplifier having a first input receiving the second bandgap voltage, a second input and an output;
- a PMOS transistor having a gate coupled to the output, a source coupled to a power supply and a drain coupled to the second input; and
- a resistor coupled between the drain and a ground,
- wherein the magnitude of the regulator current is the second bandgap voltage divided by the resistance of the resistor.

8. The PVT-independent current-controlled oscillator as claimed in claim 2, wherein the pair of PMOS transistors comprises:
- a first PMOS transistor having a first gate coupled to the bandgap circuit, a first source coupled to a power supply, and a first drain; and
- a second PMOS transistor having a second gate coupled to the first regulator circuit, a second source coupled to the power supply, and a second drain coupled to the first drain for providing the temporary total current.

9. The PVT-independent current-controlled oscillator as claimed in claim 2, wherein the second regulator circuit comprises:
- a resistor having a first end coupled to the pair of PMOS transistors, and a second end coupled to a ground.
- an operational amplifier having a first input coupled to the first end of the resistor, a second input and an output;
- a first PMOS transistor having a first gate coupled to the output, a first source coupled to a power supply, and a first drain coupled to the second input;
- a second PMOS transistor having a second gate coupled to the first gate, a second source coupled to the power supply, and a second drain coupled to the current-controlled oscillator and the PV-controller for providing the total current thereto; and
- a high-precision resistor coupled between the first drain and the ground.

* * * * *